United States Patent [19]
Huang et al.

[11] Patent Number: 5,270,234
[45] Date of Patent: Dec. 14, 1993

[54] DEEP SUBMICRON TRANSISTOR FABRICATION METHOD

[75] Inventors: Daniel L. Huang, Poughkeepsie; Louis L. Hsu, Fishkill; Wen-Yuan Wang, Hopewell Junction, all of N.Y.

[73] Assignee: International Business Machines Corporation, Armonk, N.Y.

[21] Appl. No.: 968,788

[22] Filed: Oct. 30, 1992

[51] Int. Cl.$^5$ ............................................. H01L 21/336
[52] U.S. Cl. ............................................. 437/44; 437/45; 437/228; 437/978; 148/DIG. 113; 156/645; 156/653
[58] Field of Search ............... 437/40, 41, 44, 45, 437/978, 228; 156/653, 636, 645; 148/DIG. 113; 257/344

[56] References Cited

U.S. PATENT DOCUMENTS

| | | |
|---|---|---|
| 4,378,627 | 4/1983 | Jambotka ............... 437/40 |
| 5,034,351 | 7/1991 | Sun et al. ............... 437/41 |
| 5,082,794 | 1/1992 | Pfiester et al. ......... 437/40 |
| 5,143,860 | 9/1992 | Mitchell et al. ....... 437/43 |
| 5,175,119 | 12/1992 | Matsutani ............... 437/44 |

FOREIGN PATENT DOCUMENTS 2-309646 12/1990 Japan ..................... 437/44

OTHER PUBLICATIONS

Rye, R., "Hot Filament Activated . . . ", I. Vac. Sci. Technol. A9(3), May/Jun. 1991, pp. 1099–1103.
Kolenkow, R., et al., "Chemical-Mechanical Wafer Polishing . . . ", Solid State Technology, Jun. 1962, pp. 112–114.
Gildenblat, G., et al., "Electrical Characteristics of Schottky . . . ", Appl. Phys. Lett., 53(7), 15 Aug. 1988, pp. 586–588.

Primary Examiner—T. N. Quach

[57] ABSTRACT

A deep submicron transistor fabrication method that employs only optical lithography involves the formation of a relatively wide aperture using optical techniques; the formation of composite sidewalls having differential etch resistance in the aperture to define a final aperture width less than that available with conventional optical techniques; the etching of the final aperture to expose a controlled channel length; the implantation of the channel through the aperture; and the implantation of source and drain with the sidewalls protecting previously doped LDD regions in the active area.

32 Claims, 2 Drawing Sheets

DEEP SUBMICRON TRANSISTOR FABRICATION METHOD

TECHNICAL FIELD

The invention relates to MOS integrated circuits, including CMOS integrated circuits, in the deep submicron region.

BACKGROUND OF THE INVENTION

For transistors having dimensions of less than 0.4 micron (the deep submicron region), the resolution limits of optical technology are approached. In order to avoid exotic technologies such as x-ray lithography, it is preferable to devise a method of manufacturing a CMOS transistor that does not press the limits of the optical methods.

The problem addressed by the present invention is that of providing reliable control of the channel length in a dimensional range smaller than that in which optical methods are reliable.

SUMMARY OF THE INVENTION

The invention relates to a method of forming a deep submicron transistor in which an aperture is opened in a polish stop layer having a dimension that is considerably larger than the final channel width and within the limits of optical lithography. Sidewalls are formed within the aperture in a controllable manner to determine the final channel width of the transistor. The thickness of the sidewalls is maintained during the fabrication process by the use of a two-component sidewall and a selective etch, so that the etching process that determines the final channel dimension does not change the sidewall thickness. The channel implant is local, not blanket, eliminating the need to counterdope the source and drain areas.

BEST MODE FOR CARRYING OUT THE INVENTION

Figure 1:
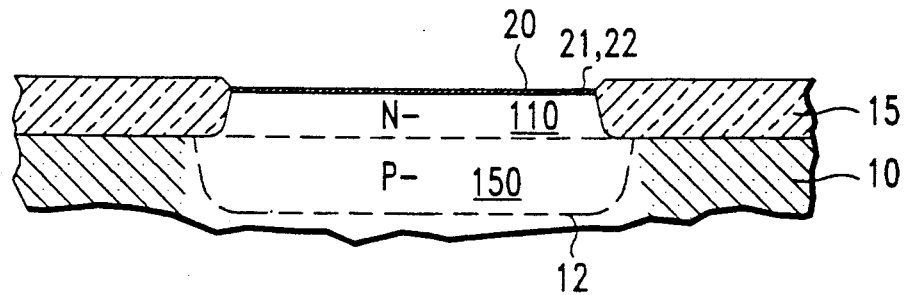
FIGS. 1 through 10 illustrate cross sections of a transistor site in various steps of formation.

Referring now to FIG. 1, there is shown a cross section of a P−integrated circuit wafer 10, in which a transistor site or active area 150 is formed between two field areas 15. The steps of preparing the wafer, forming the field areas, etc. are conventional. The transistor will be an N-channel device and those skilled in the art will readily be able to manufacture P-channel devices in the light of this disclosure. The active areas will have a dopant concentration of a first polarity, which may be that of the substrate or may be that of a "well" formed in the substrate. Field areas 15 may be formed by a conventional field oxide ($SiO_2$) or may be formed by a trench process. On the top of active area 150 there is a protective layer of initial nitride ($Si_3Na$) 22 and initial high quality dry oxide 21 (collectively referred to as layer 20) having a nominal thickness of 12 nm for nitride 22 and 8 nm for oxide 21. Oxide 21 is preferably a dry oxide because it will be left in place over the LDD areas of the source and drain. Within the active area there is a region, denoted by the numeral 110, that has been implanted with a dose of phosphorus of $4 \times 10^{13}/CM^2$ at 35 KeV to convert P−substrate 10 to the N−doping concentration that is suitable for the low doped drain LDD portion of the transistor. The depth of implantation is not critical, since punch through and threshold adjustment implants will be performed later. The notation used here is conventional, with P− and N− meaning a volume density of approximately $1 \times 10^{15}/CM^3$ and P+ and N+ meaning a volume density of $1 \times 10^{17}/CM^3$.

Figure 2:
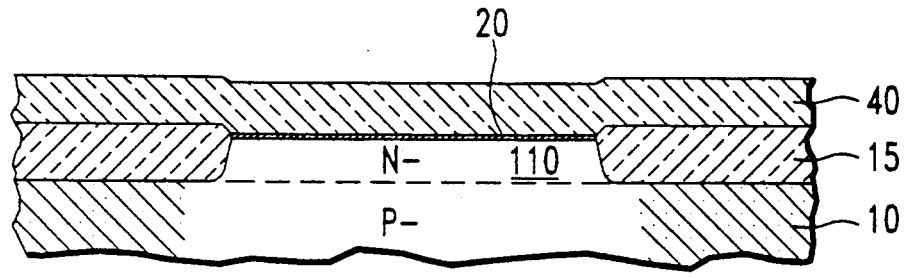

Referring to FIG. 2, there is shown active area 150 after the deposition of a layer of CVD boronitride 40 (deposited as taught in "Hot filament activated chemical vapor deposition of boron nitride" R. R. Rye, J. Vac. Sci. Tech. A9 (3) May/Jun 1991, p1099), having a thickness equal to the desired thickness of the transistor gate, nominally 300 nm in the preferred embodiment. This boronitride layer will be referred to as a polish-stop layer, since a subsequent layer of polysilicon (poly) will be polished down to stop on layer 40.

Figure 3:
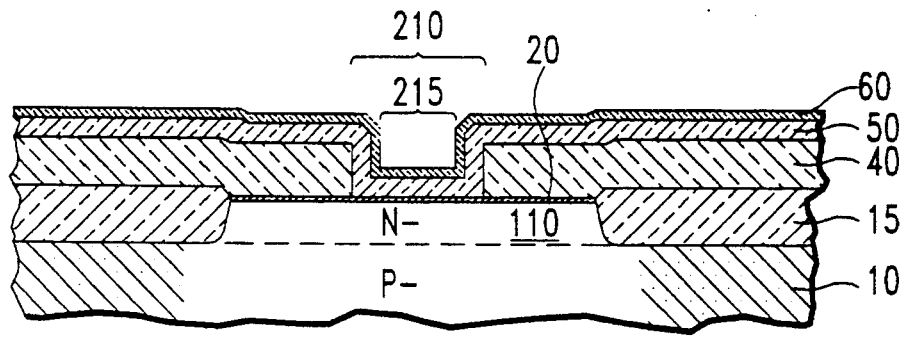

In FIG. 3, an aperture 210 having a transverse dimension of 800 nm, indicated by the bracket, has been formed in boronitride 40 by conventional optical lithography and a reactive ion etch RIE process using a $CF_4/O_2$ plasma. The final channel width has a nominal value of less than 0.4 micron in this embodiment, which is difficult to establish reliably with optical lithography. The following example illustrates parameters that result in a physical channel length of about 0.4 μm.

Two sidewall layers, a first layer of CVD oxide 50, having a thickness of 200 nm, and a second layer of CVD nitride 60, having a thickness of 12 nm, have been put down conformally as known in the art, so that the interior dimension of the aperture 210 is controlled very tightly. The deposition is conventional, well known to those skilled in the art.

Figure 4:
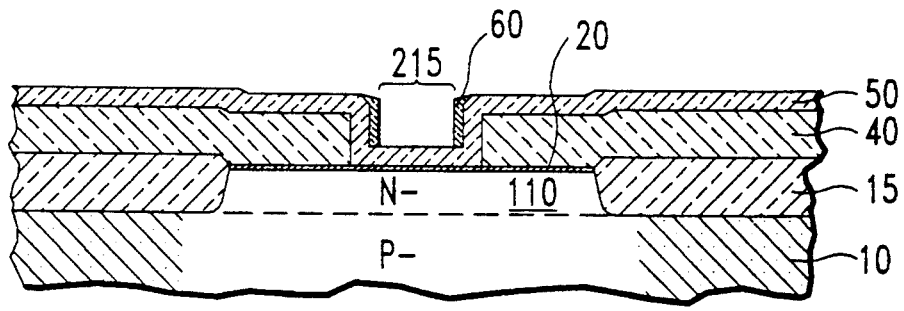

Referring now to FIG. 4, a first selective etching step using an anisotropic dry etch of $CHF_3/Cl_2$ has removed the CVD nitride layer 60 from all the horizontal surfaces without affecting the vertical nitride sidewalls in aperture 210.

Figure 5:
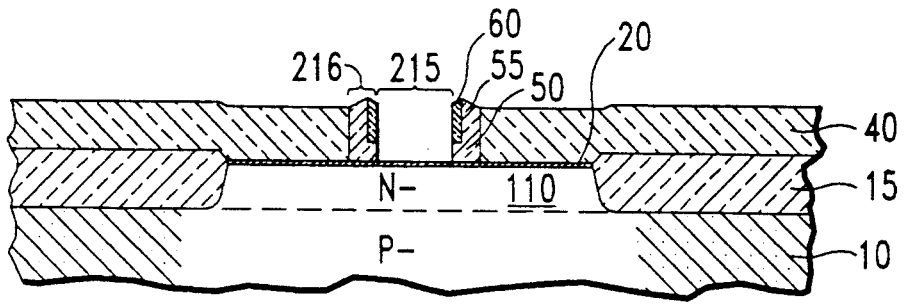

In the next step in FIG. 5, a second selective etching step using a $CF_4/O_2$ plasma has removed the CVD oxide 50 at the bottom of the aperture. The initial silicon nitride 22 in the channel area has served as an etch stop. The sidewalls within aperture 210 have a nominal thickness denoted by the bracket 216 that has not been affected by the second etch because this second etch has essentially no affect on the nitride sidewalls 60. Because of the anisotropic etch, there is no horizontal etch at the bottom of aperture 215. There may be some etching of sidewall 50 behind sidewall 60 because of process tolerances, but that has no effect on the aperture dimension, which is set by sidewalls 60. The result is a tightly controlled interior final aperture 215. In the preferred embodiment, dimension 216 is 210 nm with a tolerance of ±5 nm. This combines with a tolerance of 10 nm in the width of aperture 210 to give a width of 380±5 nm for aperture 215.

Figure 6:
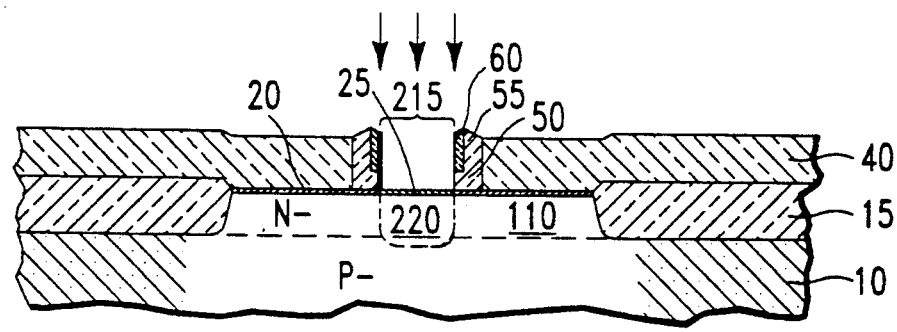
Figure 7:
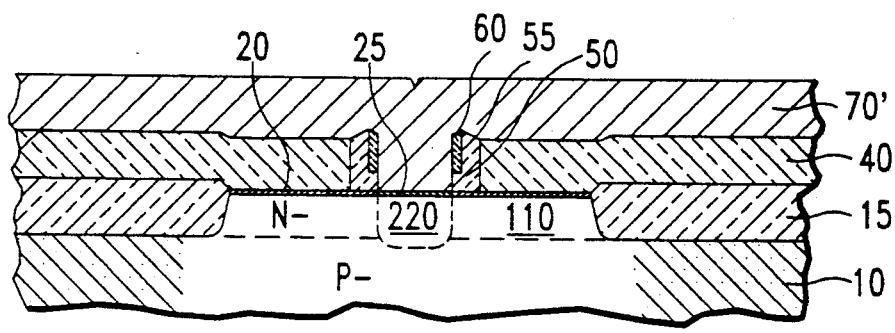
Figure 8:
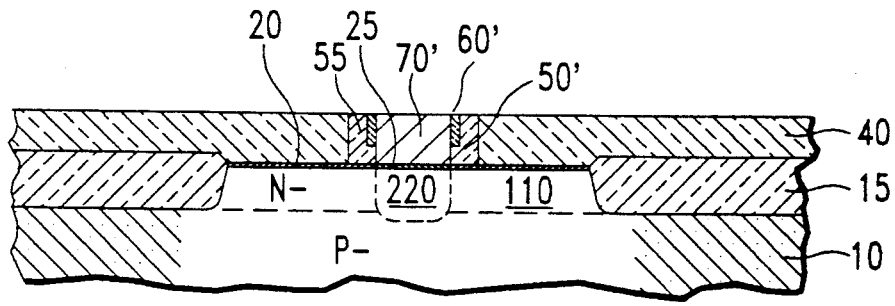

Referring now to FIG. 6, a boron implantation of $1 \times 10^{12}/CM^2$ at 15 KeV to establish the threshold level and a is boron implant of $3 \times 10^{12}/CM^2$ at 140 KeV to prevent punch through between the source and drain have implanted the channel in an area denoted by the numeral 220 to convert the initial N−doping to P−(referred to as counterdoping). After these channel implants, the initial nitride and oxide layers are stripped by a conventional wet etch and a gate oxide 25 is grown within aperture 215. The gate oxide is preferably grown after the channel implant step so that it will be free from implant damage. It has been found that transistors in the deep submicron region are highly sensitive to the quality of the gate oxide, so that the small amount of implant damage to the gate oxide that was tolerable for longer channel lengths is no longer acceptable.

U.S. Pat. No. 5,082,794 illustrates in FIGS. 7-10 the formation of an inverse-T transistor by means of a local channel implant through an aperture having nitride sidewalls. This patent says nothing about the use of guidewall thickness control to provide a short channel unobtainable with conventional optical processing. The figures in that patent illustrate single-material sidewalls having a non-uniform thickness that teaches away from the present invention because variation in sidewall thickness will result in a poorly defined channel length. In addition, the channel implant was done through the bottom polysilicon gate as well as the gate oxide. as a result, the damaged gate oxide will have a low breakdown voltage that eventually leads to reliability problems because of the hot carrier effect.

In the next step, a layer 70' of polysilicon has been deposited filling up aperture 215 and extending above the aperture by some tolerance amount to assure full coverage of the aperture. A conventional chemical-mechanical polishing step such as that illustrated in "Chemical-Mechanical wafer Polishing and Planarization in Batch System", (Solid State Technology, June 1992, p 112) is performed (FIG. 8) in which polysilicon 70' is polished away, leaving a polysilicon gate 70, having a planar top surface, within aperture 215. Polish-stop 40 has performed its function of setting the reference for the polishing operation. At this time, the top of gate 70 can be silicided if desired to reduce the gate resistivity.

Figure 9:
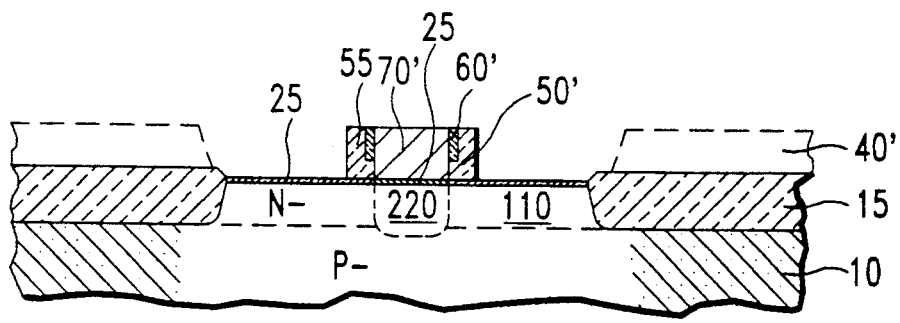
Figure 10:
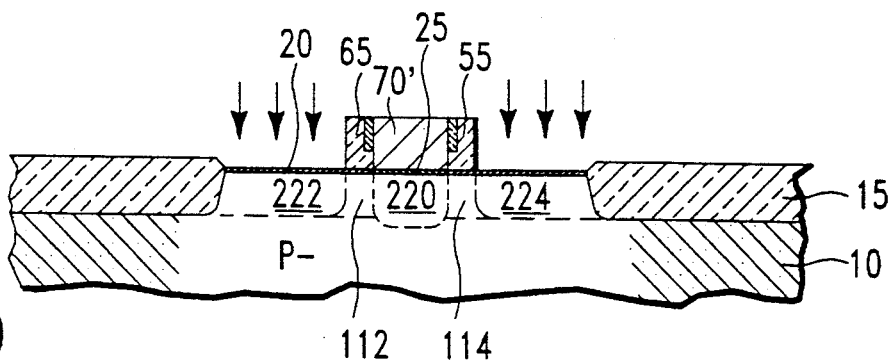

Layer 40 is then removed in FIG. 9 by a selective wet or dry etch, leaving a gate structure comprising the gate 70 consisting of the remainder of the polysilicon and the two composite sidewalls 55. If desired, a non-critical mask step can be used to expose the transistor site and layer 40 can be removed only over the source and drain. The boronitride in layer 40 etches much more quickly than the material of the gate structure, so that the gate structure does not need to be protected. In FIG. 10, an N+implant of As with a dose of $2 \times 10^{15}/CM^2$ at 80 KeV is performed to implant source 222 and drain 224 with a conventional N* concentration. The result is an LDD transistor having a tightly controlled channel width of 380 ±5 nm in the area 220 that has been accomplished without the need to define an aperture of that size.

In a corresponding P-channel transistor, the relevant parameters are:

LDD: B, $6 \times 10^{13}$ at 15 KeV
S/D: B, $3 \times 10^{15}/cm^2$ at 20 KeV
$V_t$ adjust: P, $1 \times 10^{12}/cm^2$ at 60 KeV
Punch through: P, $5 \times 10^{12}/cm^2$ at 180 KeV Those skilled in the art will readily be able to modify the embodiment illustrated to suit their purposes. Different combinations of material may be used for the polish stop and the two sidewalls, so long as differential etch and/or polish resistance is still present. Sidewalls 55 may be removed or left in place as desired. The LDD implant could be done after the gate is defined and after removal of sidewalls 55. The LDD implant could also be done after aperture 216 is formed and before formation of sidewalls 55, other polish stop materials, such as CVD diamond ("Electrical characteristics of Schottky diodes fabricated using plasma assisted chemical vapor deposited diamond films", Appl. Phys. Lett. 53(7), 15 Aug 1988, p 586) or CVD silicon carbide could be used. If sidewalls 55 are damaged during the RIE steps, they may be stripped and regrown before the Source/Drain implant.

The scope of the following claims is not meant to be limited to the embodiments disclosed herein, but to include modifications falling within the spirit of the invention.

What is claimed is:

1. A method of forming a field effect transistor in an integrated circuit silicon substrate comprising the steps of:

preparing said silicon substrate by defining a transistor active area having a first dopant concentration of a first polarity dopant and having source, drain and channel areas therein;

doping at least an LDD portion of said transistor active area with an LDD dose of ions, said LDD portion comprising an LDD source sub-portion and an LDD drain sub-portion of said transistor active area located between said channel area and said source and drain areas, respectively;

forming a polish stop layer having a polish stop thickness over said active area;

patterning said polish stop layer to define a first aperture having a first aperture width, said first aperture having first aperture sidewalls having a sidewall height equal to said polish stop thickness and a first aperture bottom surface;

forming a first sidewall layer of a first conformal sidewall material to a first sidewall layer thickness extending inwardly from said first aperture sidewalls and upwardly from said first aperture bottom surface;

forming a second sidewall layer of a second conformal sidewall material in contact with said first sidewall layer to a second sidewall layer thickness, said first and second sidewall layers together forming composite sidewalls on said first aperture sidewalls, said composite sidewalls thereby defining a second aperture having a second aperture width less than said first aperture width and a second aperture bottom surface;

performing at least one selective directional etch, using a directional etchant, downwardly through said second and first conformal sidewall materials in said second aperture bottom surface, said directional etchant and said first and second conformal sidewall materials being related such that said directional etchant attacks said first conformal sidewall material in preference to said second conformal sidewall material;

performing a local channel implant through said second aperture to form a transistor channel in said channel area, whereby said transistor has a channel length determined by said second aperture width;

growing a layer of gate oxide in said second aperture;

filling said second aperture with a layer of gate material;

removing said layer of polish stop material at least over said source and drain areas;

implanting said source and drain areas with a source ion dose at a source implant energy to form a source and drain for said transistor, said source implant energy being related to said sidewall height such that said sidewalls block said source ion dose, whereby said transistor has a heavily doped source and drain separated from said channel by said LDD portion of said transistor active area.

2. A method according to claim 1, in which said step of doping said LDD portion is performed after said step of implanting said source and drain and an additional step of removing said composite sidewalls.

3. A method according to claim 2, in which said step of preparing said silicon substrate includes a step of growing a layer of dry oxide over said transistor active area.

4. A method according to claim 3, in which a step of polishing said layer of gate material down to said polish stop layer is performed after deposition of said layer of gate material, whereby a gate bracketed by said composite sidewalls is formed in said second aperture of said gate material.

5. A method according to claim 4, further including a step of forming a protective etch stop layer on said substrate before said step of forming said polish stop layer and in which said etch stop layer serves as an etch stop for said at least one selective directional etch and in which said protective etch stop layer is removed after said step of performing a local channel implant, whereby said etch stop layer protects said silicon substrate form etch and implant damage in said channel area.

6. A method according to claim 5, in which said step of removing said layer of polish stop material includes a step of patterning said layer of polish stop material to expose said transistor active area while retaining said layer of polish stop material in other portions of said integrated circuit.

7. A method according to claim 5, in which said step of removing said layer of polish stop material includes a step of patterning said layer of polish stop material to expose said transistor active area while retaining said layer of polish stop material in other portions of said integrated circuit.

8. A method according to claim 5, in which said first sidewall material is nitride and said second sidewall material is oxide.

9. A method according to claim 8, in which said polish stop material is boronitride.

10. A method according to claim 1, in which said step of doping said LDD portion is performed after said step of forming said first aperture and before said step of forming said composite sidewalls and in which said local channel implant is sufficient to counterdope ions in said channel area that were implanted during said step of implanting said LDD areas.

11. A method according to claim 10, in which said step of preparing said silicon substrate includes a step of growing a layer of dry oxide over said transistor active area.

12. A method according to claim 11, in which a step of polishing said layer of gate material down to said polish stop layer is performed after deposition of said layer of gate material, whereby a gate bracketed by said composite sidewalls is formed in said second aperture of said gate material.

13. A method according to claim 12, further including a step of forming a protective etch stop layer on said substrate before said step of forming said polish stop layer and in which said etch stop layer serves as an etch stop for said at least one selective directional etch and in which said protective etch stop layer is removed after said step of performing a local channel implant, whereby said etch stop layer protects said silicon substrate form etch and implant damage in said channel area.

14. A method according to claim 13, in which said step of removing said layer of polish stop material includes a step of patterning said layer of polish stop material to expose said transistor active area while retaining said layer of polish stop material in other portions of said integrated circuit.

15. A method according to claim 13, in which said step of removing said layer of polish stop material includes a step of patterning said layer of polish stop material to expose said transistor active area while retaining said layer of polish stop material in other portions of said integrated circuit.

16. A method according to claim 13, in which said first sidewall material is nitride and said second sidewall material is oxide.

17. A method according to claim 16, in which said polish stop material is boronitride.

18. A method according to claim 1, in which said step of doping said LDD portion is performed before said step of forming said polish stop layer and in which said local channel implant is sufficient to counterdope ions in said channel area that were implanted during said step of implanting said LDD portion.

19. A method according to claim 18, in which said step of preparing said silicon substrate includes a step of growing a layer of dry oxide over said transistor active area.

20. A method according to claim 19, in which a step of polishing said layer of gate material down to said polish stop layer is performed after deposition of said layer of gate material, whereby a gate bracketed by said composite sidewalls is formed in said second aperture of said gate material.

21. A method according to claim 20, further including a step of forming a protective etch stop layer on said substrate before said step of forming said polish stop layer and in which said etch stop layer serves as an etch stop for said at least one selective directional etch and in which said protective etch stop layer is removed after said step of performing a local channel implant, whereby said etch stop layer protects said silicon substrate form etch and implant damage in said channel area.

22. A method according to claim 21, in which said step of removing said layer of polish stop material includes a step of patterning said layer of polish stop material to expose said transistor active area while retaining said layer of polish stop material in other portions of said integrated circuit.

23. A method according to claim 21, in which said step of removing said layer of polish stop material includes a step of patterning said layer of polish stop material to expose said transistor active area while retaining said layer of polish stop material in other portions of said integrated circuit.

24. A method according to claim 21, in which said first sidewall material is nitride and said second sidewall material is oxide.

25. A method according to claim 24, in which said polish stop material is boronitride.

26. A method according to claim 1, in which said step of preparing said silicon substrate includes a step of growing a layer of dry oxide over said transistor active area.

27. A method according to claim 26, in which a step of polishing said layer of gate material down to said polish stop layer is performed after deposition of said layer of gate material, whereby a gate bracketed by said composite sidewalls is formed in said second aperture of said gate material.

28. A method according to claim 27, further including a step of forming a protective etch stop layer on said substrate before said step of forming said polish stop layer and in which said etch stop layer serves as an etch stop for said at lest one selective directional etch and in which said protective etch stop layer is removed after said step of performing a local channel implant, whereby said etch stop layer protects said silicon substrate from etch and implant damage in said channel area.

29. A method according to claim 27, in which said step of removing said layer of polish stop material includes a step of patterning said layer of polish stop material to expose said transistor active area while retaining said layer of polish stop material in other portions of said integrated circuit.

30. A method according to claim 28, in which said step of removing said layer of polish stop material includes a step of patterning said layer of polish stop material to expose said transistor active area while retaining said layer of polish stop material in other portions of said integrated circuit.

31. A method according to claim 28, in which said first sidewall material is nitride and said second sidewall material is oxide.

32. A method according to claim 31, in which said polish stop material is boronitride.

* * * * *